US008653499B2

(12) United States Patent
Lee

(10) Patent No.: US 8,653,499 B2
(45) Date of Patent: Feb. 18, 2014

(54) LIGHT-EMITTING DIODE WITH STRAIN-RELAXED LAYER FOR REDUCING STRAIN IN ACTIVE LAYER

(75) Inventor: Shih-Chang Lee, Hsinchu (TW)

(73) Assignee: Epistar Corporation, Hsinchu (TW)

(*) Notice: Subject to any disclaimer, the term of this patent is extended or adjusted under 35 U.S.C. 154(b) by 67 days.

(21) Appl. No.: 13/153,690

(22) Filed: Jun. 6, 2011

(65) Prior Publication Data

US 2012/0305888 A1 Dec. 6, 2012

(51) Int. Cl.
*H01L 29/06* (2006.01)
*H01L 31/00* (2006.01)

(52) U.S. Cl.
USPC ............ 257/13; 257/E33.012; 257/E33.008; 438/47

(58) Field of Classification Search
USPC ............... 257/13, E33.012, E33.008; 438/47
See application file for complete search history.

(56) References Cited

U.S. PATENT DOCUMENTS 7,666,696 B2 * 2/2010 Hersee ............................ 438/47

* cited by examiner

*Primary Examiner* — Stephen W Smoot
*Assistant Examiner* — Vicki B Booker
(74) *Attorney, Agent, or Firm* — Muncy, Geissler, Olds & Lowe, PLLC

(57) ABSTRACT

A light-emitting diode (LED) includes a first conductivity type semiconductor layer, a strain-relaxed layer over the first conductivity type semiconductor layer, an active layer over the strain-relaxed layer, and a second conductivity type semiconductor layer over the active layer. The strain-relaxed layer includes a strain-absorbed layer over the first conductivity type semiconductor layer and a surface-smoothing layer on the strain-absorbed layer filling the cavities. The strain-absorbed layer includes a plurality of cavities in a substantial hexagonal-pyramid form.

10 Claims, 2 Drawing Sheets

LIGHT-EMITTING DIODE WITH STRAIN-RELAXED LAYER FOR REDUCING STRAIN IN ACTIVE LAYER

TECHNICAL FIELD

The application relates to a light-emitting device, in particular to a light-emitting diode with strain-relaxed layer.

DESCRIPTION OF BACKGROUND ART

The theory for a light-emitting diode (LED) to emit light is that when a forward voltage power is applied to a p-n junction, the electrons are driven from the n-type semiconductor and the holes are driven from the p-type semiconductor, and these carriers are combined in the active layer to emit light. The efficiency of an LED depends on the Internal Quantum Efficiency (IQE), which depends on the combination rate of the electrons from the n-type semiconductor and the holes from the p-type semiconductor. However, the IQE is reduced by the built-in electric field. The built-in electric field is an effect due to the piezoelectric polarizations as a result of the characteristics of the materials used for LED. For example, an LED which employs nitride films grown along the polar c-direction of a sapphire substrate suffers from the undesirable built-in electric field. The built-in electric field not only reduces the IQE, but also results in the droop effect.

A solution to reduce the built-in electric field in the active layer is to reduce the strain in the active layer. A conventional structure based on this solution is to form a single thick InGaN layer before forming the active layer to reduce the strain.

SUMMARY OF THE DISCLOSURE

A light-emitting diode comprises a first conductivity type semiconductor layer; a strain-relaxed layer over the first conductivity type semiconductor layer, the strain-relaxed layer comprising: a strain-absorbed layer over the first conductivity type semiconductor layer, the strain-absorbed layer containing a plurality of cavities in a substantial hexagonal-pyramid form; and a surface-smoothing layer on the strain-absorbed layer, the surface-smoothing layer filling the cavities; an active layer over the strain-relaxed layer; and a second conductivity type semiconductor layer over the active layer.

A method for forming a light-emitting diode comprises steps of providing a substrate; forming an first conductivity type semiconductor layer; forming a strain-relaxed layer over the first conductivity type semiconductor layer, comprising: forming a strain-absorbed layer over the first conductivity type semiconductor layer, the strain-absorbed layer containing a plurality of cavities in a substantial hexagonal-pyramid form; and forming a surface-smoothing layer on the strain-absorbed layer filling said cavities; forming an active layer over the strain-relaxed layer; and forming a second conductivity type semiconductor layer on the active layer.

DETAILED DESCRIPTION OF PREFERRED EMBODIMENTS

Figure 1:
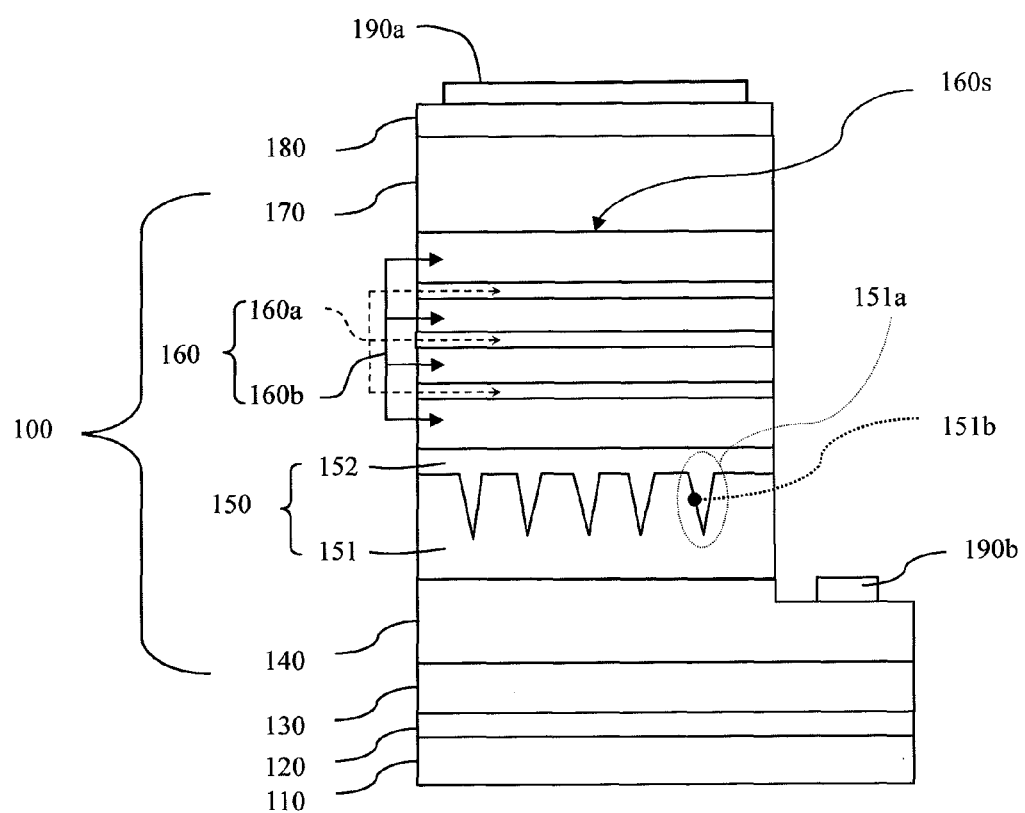
FIG. 1 is a schematic cross-sectional view of the light-emitting diode in accordance with the embodiment of the present application.

FIG. 1 illustrates an embodiment of present application. The light-emitting diode 10 is formed on a substrate 110, for example, a sapphire substrate. On the substrate 110, a buffer layer 120 is formed. The buffer layer 120 is a layer of GaN or AlN grown at a temperature, for example, 500° C.~650° C. On the buffer layer 120, an un-doped GaN layer 130 is formed. On the un-doped GaN layer 130, a main structure 100 is formed.

The main structure 100 in this embodiment includes a first conductivity type semiconductor layer 140, a second conductivity type semiconductor layer 170. For example, the first conductivity type semiconductor layer 140 is n-type, and the second conductivity type semiconductor layer 170 is p-type. And between the first conductivity type semiconductor layer 140 and the second conductivity type semiconductor layer 170, an active layer 160 is disposed. An example for the active layer 160 is a multi-quantum well structure comprising a plurality of quantum wells 160a and barrier layers 160b, wherein each quantum well 160a sandwiched by barrier layers 160b. The main structure 100 is a stack of semiconductor layers which can be formed by conventional epitaxy technology with proper doping if necessary, and materials for each layer is composition of $Al_xIn_yGa_{(1-x-y)}N$ ($0 \leq x \leq 1$, $0 \leq y \leq 1$, $0 \leq x+y \leq 1$). For example, the first conductivity type semiconductor layer 140 is a GaN layer doped with Si, and the second conductivity type semiconductor layer 170 is a GaN layer doped with Mg. The quantum wells 160a are InGaN layers, and barrier layers 160b are GaN layers.

The main structure 100 further includes a strain-relaxed layer 150 between the first conductivity type semiconductor layer 140 and the active layer 160. The strain-relaxed layer 150 comprises a strain-absorbed layer 151 over the first conductivity type semiconductor layer 140, and a surface-smoothing layer 152 on the strain-absorbed layer 151. The strain-absorbed layer 151 contains a plurality of cavities 151a in a substantial hexagonal-pyramid form, and the surface-smoothing layer 152 fills the cavities 151a to provide a smooth surface for the subsequent formation of active layer 160. Comparing with the conventional single thick InGaN layer structure, the strain-absorbed layer 151 contains six slopes 151b in each of the substantial hexagonal-pyramid form cavities 151a, wherein each slope forms a side surface of the hexagonal-pyramid in a triangular shape, and the slopes 151b function to absorb the strain in horizontal direction, which is parallel to the top surface 160s of the active layer 160, and convert part of the strain in horizontal direction into vertical direction. Therefore, the strain-absorbed layer 151 is more efficient to reduce the strain in the active layer 160 than the conventional single thick InGaN layer structure is. The surface-smoothing layer 152 is preferred to be thin while filling the cavities 151a providing a smooth surface for subsequent formation of active layer 160.

Figure 2:
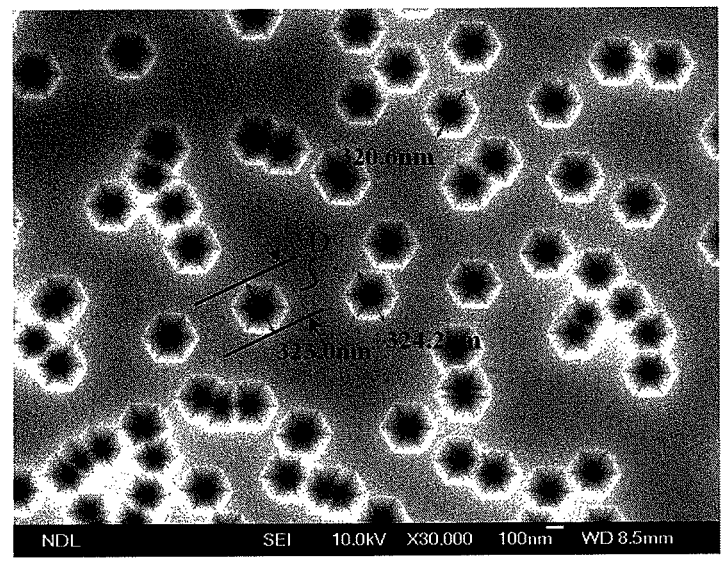
FIG. 2 is an SEM photograph showing the top view of the strain-absorbed layer formed in accordance with the embodiment of the present application.

FIG. 2 is a SEM (scanning electron microscope) photograph showing the top view of the strain-absorbed layer 151 formed after the n-type GaN layer of the first conductivity type semiconductor layer 140 grown by MOCVD. In this embodiment, the strain-absorbed layer 151 is $In_{0.1}Ga_{0.9}N$ layer with a thickness of 0.5 µm formed in an environment with a temperature of 900° C. and pressure of 300 torr with N2 provided. In some embodiments, the temperature may be 750° C.~950° C., and the pressure may be 200 torr~500 torr. The thickness of the InGaN layer of the strain-absorbed layer 151 may be 0.1~1 μm. As shown in the picture, the shape of the top view of the cavity 151a is a hexagon with a diagonal length D of about 320 nm in this embodiment. And in some embodiments, the diagonal length may be 100 nm-1000 nm. The size of the cavities 151a can be controlled by controlling the thickness of the strain-absorbed layer 151, and thus a ratio of area covered by the cavities 151a to the area of the surface of the strain-absorbed layer 151, which is in proportion to the size of the cavities 151a, can be controlled for reducing the strain effectively. In some embodiments, the above ratio may be 0.2~1.0.

The surface-smoothing layer 152 is a GaN layer subsequently formed in an environment with a temperature of 1000° C. and pressure of 100 torr with $H_2$ provided. In some embodiments, the temperature may be 950° C.~1100° C., and the pressure may be 50 torr~200 torr. The thickness of the GaN layer of the surface-smoothing layer 152 may be 100 Å~1000 Å. As in previous description, the above condition is preferred to make the surface-smoothing layer 152 thin while filling the cavities 151a providing a smooth surface for subsequent formation of active layer 160. As shown in this embodiment, the strain-absorbed layer 151 and the surface-smoothing layer 152 are preferred to be different materials to achieve a better effect in reducing the strain.

Figure 3:
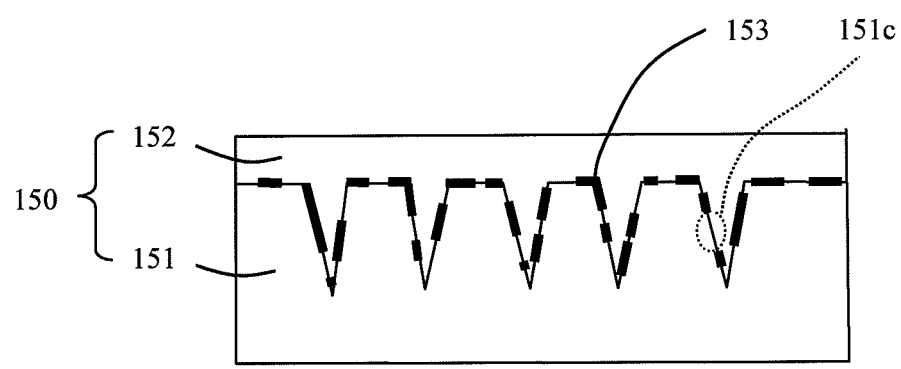
FIG. 3 is a schematic cross-sectional view of strain-relaxed layer having grain boundaries between the strain-absorbed layer and the surface-smoothing layer.

To achieve a better effect in reducing the strain, it is also preferred that the strain-relaxed layer 150 further comprises incontinuous interface material 153 formed by $SiN_x$ or $SiO_x$ between the strain-absorbed layer 151 and the surface-smoothing layer 152. This is illustrated in FIG. 3. For example, incontinuous interface material 153 formed by $SiN_x$ may be formed by introducing $Si_2H_6$ and $NH_3$ with a temperature of 800° C.~1000° C. and pressure of 50 torr-760 torr after the formation of the strain-absorbed layer 151. The incontinuous interface material 153 separates the interface of the strain-absorbed layer 151 and the surface-smoothing layer 152 into sections 151c. Since the interface of the strain-absorbed layer 151 and the surface-smoothing layer 152 is not continuous, and the lattice constant mismatch is more serious between the surface-smoothing layer 152 and incontinuous interface material 153 than the lattice constant mismatch between the surface-smoothing layer 152 and the strain-absorbed layer 151, it provides more dislocations for strain release between the strain-absorbed layer 151 and the surface-smoothing layer 152. Comparing with the embodiment without such incontinuous interface material 153, this embodiment provides a better effect in reducing the strain.

In addition to the main structure 100, other conventional layers or elements can be formed in the LED 10. As illustrated in FIG. 1, a transparent conductive layer (TCL) 180 is formed on the second conductivity type semiconductor layer 170 of the main structure 100. The transparent conductive layer (TCL) 180 can be, for example, ITO. And a second electrode 190a with a finger structure is optionally formed on the transparent conductive layer (TCL) 180. For a horizontal type LED of this embodiment, a mesa process to expose part of the first conductivity type semiconductor layer 140 is carried out, and the first electrode 190b is formed at the same time when the second electrode 190a is formed.

Though the embodiments described above are illustrated by a horizontal type LED and specific materials, it will be apparent that other alternatives, modifications and materials may be made to the embodiments without escaping the spirit and scope of the application.

What is claimed is:
1. A light-emitting diode (LED) comprising:
a first conductivity type semiconductor layer;
a strain-relaxed layer over the first conductivity type semiconductor layer, the strain-relaxed layer comprising:
a strain-absorbed layer over the first conductivity type semiconductor layer, wherein the strain-absorbed layer containing a plurality of cavities each having a hexagonal top view and a triangular cross-section; and
a surface-smoothing layer on the strain-absorbed layer, the surface-smoothing layer filling the cavities;
an active layer over the strain-relaxed layer; and
a second conductivity type semiconductor layer over the active layer.
2. The LED as claimed in claim 1, further comprising:
a transparent conductive layer over the second conductivity type semiconductor layer;
a second electrode on the transparent conductive layer;
a first electrode on the first conductivity type semiconductor layer; and
a substrate under the first conductivity type semiconductor layer.
3. The LED as claimed in claim 1, further comprising a buffer layer formed between a substrate and the first conductivity type semiconductor layer.
4. The LED as claimed in claim 1, further comprising discontinuous interface material between the strain-absorbed layer and the surface-smoothing layer formed by SiNx or SiOx.
5. The LED as claimed in claim 1, wherein the strain-absorbed layer and the surface-smoothing layer are composed of different materials.
6. The LED as claimed in claim 1, wherein the strain-absorbed layer is InGaN with a thickness from 0.1 μm to 1 μm.
7. The LED as claimed in claim 1, wherein the surface-smoothing layer is GaN with a thickness from 100 Å to 1000Å.
8. The LED as claimed in claim 1, wherein a ratio of area covered by the cavities to the area of the surface of the strain-absorbed layer is from 0.2 to 1.0.
9. The LED as claimed in claim 1, wherein one of the cavities has a diagonal length from 100 nm to 1000 nm.
10. The LED as claimed in claim 1, wherein each of the cavities contains six slopes to absorb a strain in horizontal direction and convert part of the strain in horizontal direction into vertical direction.

* * * * *